(12) United States Patent
Lai et al.

(10) Patent No.: US 10,021,778 B2
(45) Date of Patent: Jul. 10, 2018

(54) DISPLAY MODULE HAVING DIFFERENT CURVATURE DESIGN

(71) Applicant: AU OPTRONICS CORPORATION, Hsin-Chu (TW)

(72) Inventors: Ming-Sheng Lai, Hsin-Chu (TW); Pei-Ling Chiang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 301 days.

(21) Appl. No.: 14/851,795

(22) Filed: Sep. 11, 2015

(65) Prior Publication Data

US 2016/0095206 A1    Mar. 31, 2016

(30) Foreign Application Priority Data

Sep. 26, 2014    (TW) .............................. 103133529 A (51) Int. Cl.
*G02F 1/1333*    (2006.01)
*H05K 1/02*    (2006.01)

(52) U.S. Cl.
CPC ......... *H05K 1/0271* (2013.01); *H05K 1/0284* (2013.01); *H05K 2201/09018* (2013.01); *H05K 2201/10128* (2013.01); *H05K 2201/10136* (2013.01)

(58) Field of Classification Search
CPC .................. H05K 1/0271; G02F 1/133308
See application file for complete search history.

(56) References Cited

U.S. PATENT DOCUMENTS

| 2007/0103776 | A1   | 5/2007  | Cok et al.               |
|--------------|------|---------|--------------------------|
| 2009/0002973 | A1 * | 1/2009  | Watanabe ............... H01L 24/18 361/820 |
| 2009/0096965 | A1 * | 4/2009  | Nagata ............. G02F 1/133305 349/103 |
| 2012/0020056 | A1 * | 1/2012  | Yamagata ......... G02F 1/133308 362/97.1 |
| 2014/0132487 | A1   | 5/2014  | Park et al.              |
| 2014/0133073 | A1   | 5/2014  | Ahn et al.               |
| 2014/0254121 | A1 * | 9/2014  | Jung .................... H05K 1/0271 361/774 |
| 2016/0299526 | A1 * | 10/2016 | Inagaki ............. G02F 1/133305 |

FOREIGN PATENT DOCUMENTS

| CN | 103810942 A | 5/2014 |
| TW | 201419524   | 5/2014 |
| TW | M483445     | 8/2014 |

OTHER PUBLICATIONS

Office Action issued in corresponding patent application in China dated May 5, 2016.

* cited by examiner

*Primary Examiner* — James Dudek
(74) *Attorney, Agent, or Firm* — McClure, Qualey & Rodack, LLP (57) ABSTRACT

A display module includes a display panel which includes a substrate and a periphery circuit. The substrate has a display area and a strip region beside the display area. The substrate is bent with respect to an axis to form a curved shape. The maximum value of the curvature of the display area in a direction perpendicular to the axis is a first curvature. The periphery circuit is disposed on the strip region. The strip region in a direction perpendicular to the axis has a second curvature smaller than the first curvature.

9 Claims, 11 Drawing Sheets

DISPLAY MODULE HAVING DIFFERENT CURVATURE DESIGN

BACKGROUND OF THE INVENTION

1. Field of the Invention

The present invention relates to a display module, in particular, to a display module having different curvature design.

2. Description of the Prior Art

With the development of the display technologies, in addition to the improvement of the size and quality, the appearance of the display device is also changed, such as the curved display device. Compared to the flat-panel display device, the curved display device can be made not only a larger size in the same width, but a better viewing effect can be obtained. With the flat-panel TV and the curved TV as examples, when the line of sight of the viewer moves from the center of the flat-panel TV to its sides, the viewer often has a poor visual experience on the edge of the flat-panel TV. On the other hand, because the curved TV has a curved design, the distortion on the edge of the screen can be reduced, and the visual presence can be improved.

In the conventional curved display device, it is implemented by bending the substrate to form a curved shape having the same curvature. However, according to the above approach, the periphery circuit formed on the substrate, such as a gate driving circuit, will withstand the stress of bending in the manufacturing process with the thin film transistor array substrate bent to form the curved shape, thus the circuit characteristic will be affected accordingly. For example, the decreased electron mobility and the increased threshold voltage will result in lower circuit driving capability, so that the circuit reliability will be deteriorated accordingly. In other words, at the time of forming the display device having the curved shape with better viewing, the original circuit performance would be sacrificed. Therefore, the structure of the current curved display device could be improved.

SUMMARY OF THE INVENTION

An object of the present invention is to provide a display module to maintain or enhance the circuit performance of the periphery circuit with the display surface having a design of curved shape.

A display module includes a display panel which includes a substrate and a periphery circuit. The substrate has a display area and a strip region beside the display area. The substrate is bent with respect to an axis to form a curved shape. The periphery circuit is disposed on the strip region. The maximum value of the curvature of the display area in a direction perpendicular to the axis is a first curvature. The strip region in a direction perpendicular to the axis has a second curvature smaller than the first curvature. With the design of different curvatures, the circuit performance of the periphery circuit disposed on the substrate can be improved and the circuit reliability can be enhanced.

DETAILED DESCRIPTION OF THE PREFERRED EMBODIMENT

The present invention provides a display module having a curved display surface. The display area and the strip region outside the display area of the display module have a different degree of bending, respectively, wherein the strip region is flatter than the display area, namely smaller degree of bending. The display module of the present invention can be applied to a variety of display devices, such as TVs, game consoles, and wearable devices. Further, the display panel contained in the display module may be a liquid crystal display panel, an electrophoretic display panel, an organic light emitting diode display panel, or other types of self-luminous or non-self-luminous display panels.

Figure 1A:
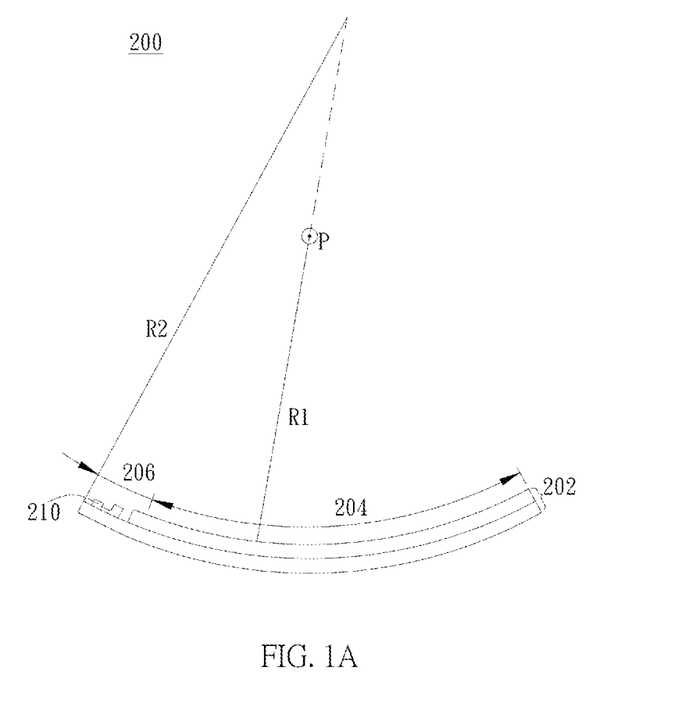
FIG. 1A shows a top view of a display module according to an embodiment of the present invention.
Figure 1B:
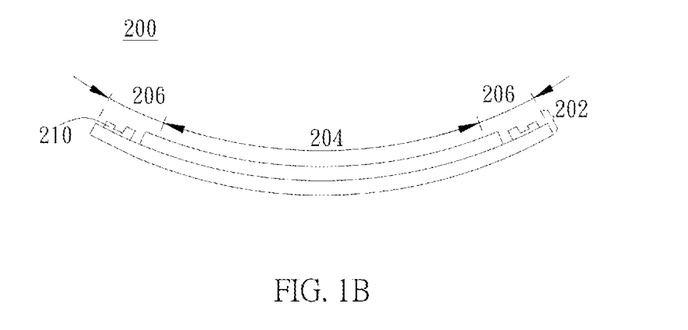
FIG. 1B shows a top view of a display module according to another embodiment of the present invention.

FIG. 1A shows a top view of a display module according to an embodiment of the present invention. As shown in FIG. 1A, the display panel 200 of the display module includes a substrate 202 and a periphery circuit 210. The substrate 202 is bent with respect to an axis P to form a curved shape and has a display area 204 and a strip region 206 beside the display area 204. The periphery circuit 210 is disposed on the strip region 206, preferably directly formed on the substrate 202 in the process, and thus it is bent with the curvature of the substrate 202. The periphery circuit 210, for example, is a gate driving circuit or a data driving circuit. Specifically, the strip region 206 is located outside one side of the display area 204 parallel to the axis P. That is, the strip region 206 is located outside the display area 204 (left side and/or right side) along the transverse direction of the bending surface. In other embodiments, the strip region 206 is not limited to merely locate on one outer side of the display area 204. As shown in FIG. 1B, the strip region 206 is located on both sides of the display area 204 parallel to the axis P, i.e., the strip region 206 is located on both outer sides of the display area 204 along the bending surface.

As shown in FIG. 1A, the display area 204 has a radius of curvature R1 from the axis P, and the strip region 206 has a radius of curvature R2; the relationship between R1 and R2 is R2>R1. For the curvature, the maximum curvature of the display area 204 on the cross section perpendicular to the axis P is a first curvature. When the curvature of the display area 204 at each position is identical, the first curvature is an average curvature of the display area 204. The portion of the strip region 206 where the periphery 210 is disposed thereon on the cross section perpendicular to the axis P has a second curvature. The second curvature preferably is the maximum curvature or the average curvature of the strip region 206. According to the relationship of the radius of curvature in the above-mentioned, the second curvature is smaller than the first curvature. In other words, the strip region 206 where the periphery circuit 210 is disposed thereon has a smaller degree of bending. In this way, the performance of the circuit characteristics of the periphery circuit 210 disposed on the strip region 206 will not be affected with the curved shape of the display panel 200. In the preferred embodiment, the value of the second curvature may be zero, i.e., the substrate 202 in the strip region 206 is formed with a plane pattern, so that the performance of the periphery circuit 210 can be further enhanced.

Figure 2:
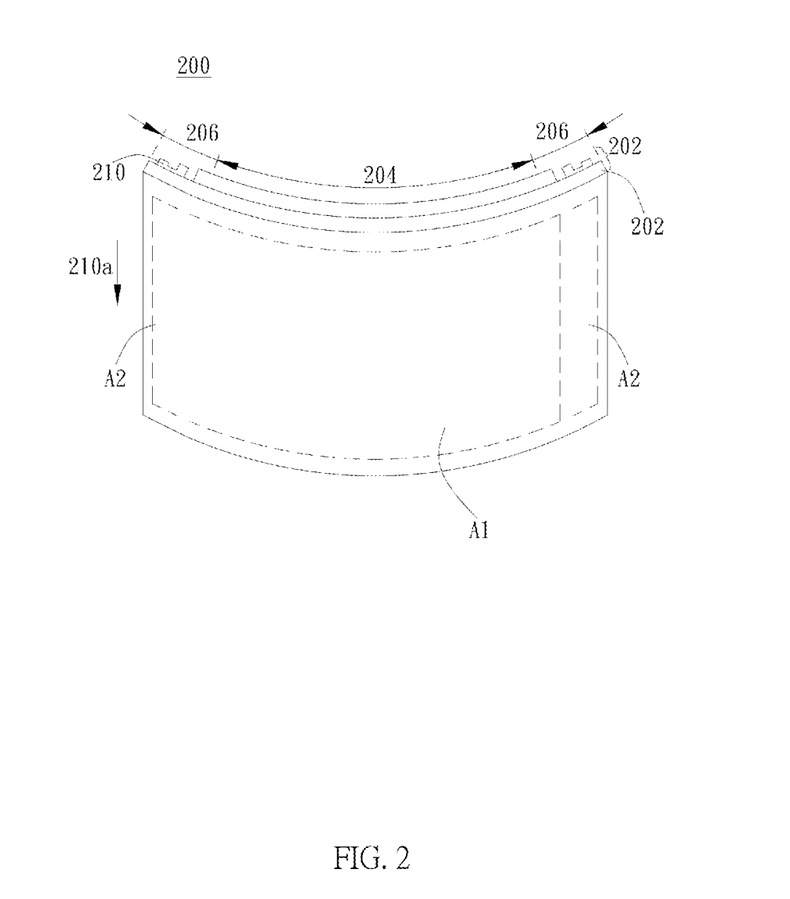
FIG. 2 shows a front view of a display module according to an embodiment of the present invention.

FIG. 2 shows a front view of a display module according to an embodiment of the present invention. As shown in FIG. 2, the display area 204 is located on the inner side of the substrate 202 (i.e., the side where the periphery circuit 210 is disposed thereon), and the strip regions 206 are disposed on both sides of the display area 204. As shown in the dashed box at the backside of the substrate 202, the zone A1 is roughly corresponding to the display area 204, and the zone A2 is roughly corresponding to the strip region 206. The periphery circuit 210 is disposed on the strip region 206 corresponding to the zone A2. The periphery circuit 210 is distributed in an elongated strip (corresponding to the depicted range of the zone A2) and has an extension direction 210a parallel to the axis P (refer to FIG. 1A).

Figure 3A:
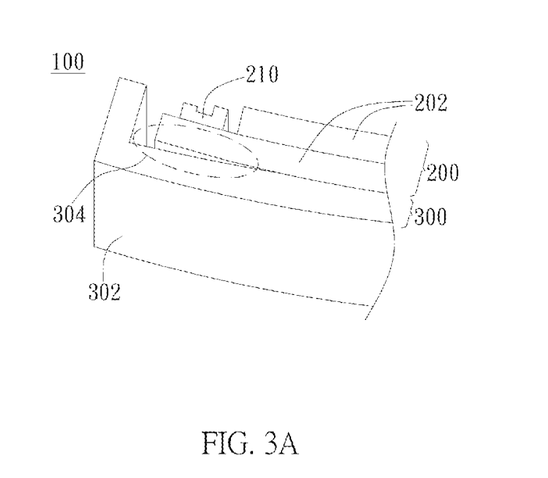
FIGS. 3A through 3D show a rear view of a display module with a curved shape according to different embodiments of the present invention, respectively.

As described in above, the substrate of the display module is bent to form a curved shape having the distribution of different curvatures; the following will describe the approach of forming different curvatures on the substrate by FIGS. 3A through 3D. FIGS. 3A through 3D show a rear view of a display module with a curved shape according to different embodiments of the present invention, respectively. As shown in FIG. 3A, the display module 100 includes a display panel 200 and a backlight module 300. The backlight module 300 is disposed on the backside of the display panel 200, i.e., the side of non-image display. The backlight module 300 includes a support frame 302 supporting the substrate 202 on a side opposite to the periphery circuit 210 and maintaining the substrate 202 into the curved shape. A portion of the support frame 302 corresponding to the strip region (the region where the periphery circuit 210 is disposed thereon) compared to another portion of the support frame 302 is retreated. As shown in FIG. 3A, the support frame 302 corresponding to the display area is attached to the substrate 202 to maintain the substrate 202 into the curved shape, and the portion of the support frame 302 corresponding to the strip region forms a depression region 304 (shown at dashed circle) and is retreated compared to another portion of the support frame 302. Thereby, the portion of the substrate 202 unattached to the support frame 302 is not supported by the support frame 302 to maintain the curved shape, thus the substrate 202 can be returned to the smaller curvature (the second curvature) from the original curvature (the first curvature) through its flexibility to achieve the design of different curvatures.

Figure 3B:
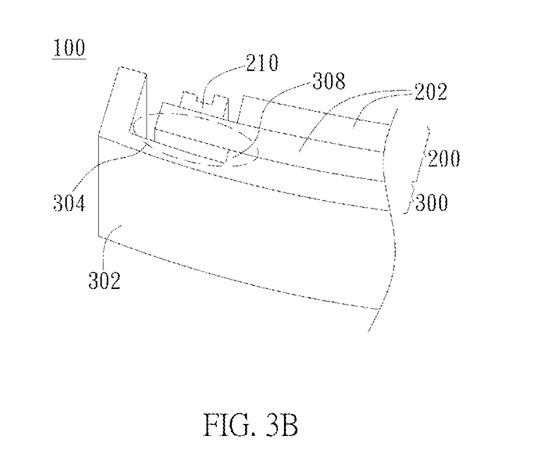

The depression region also can be formed as shown in FIG. 3B; the portion of the support frame 302 corresponding to the strip region forms a depression region 304 (shown at dashed circle). In detail, the support frame 302 is attached to the backside of the display panel 200 and extends to the front edge of the strip region to form a stage gap 308 so as to form the depression region 304 between the stage gap 308 and the portion of the support frame 302 corresponding to the strip region. Thereby, due to the depression region 304 separated by the stage gap 308, the portion of the substrate 202 corresponding to the strip region is not supported by the support frame 302 to maintain the curved shape, thus the substrate 202 can be returned to the smaller curvature (the second curvature) from the original curvature (the first curvature) through its flexibility to achieve the design of different curvatures.

Figure 3C:
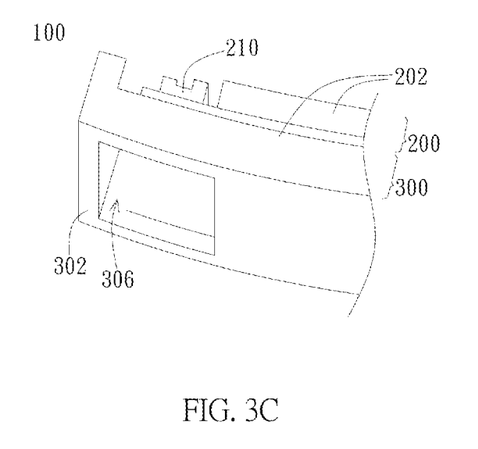

As shown in FIG. 3C, the support frame 302 is attached to the backside of the display panel 200, and the portion of the support frame 302 corresponding to the strip region forms a hollowed portion 306. Because the substrate 202 corresponding to the hollowed portion 306 is not supported by the support frame 302 to maintain the curved shape, the strip region can be returned to have a smaller curvature through the flexibility of the substrate 202.

Figure 3D:
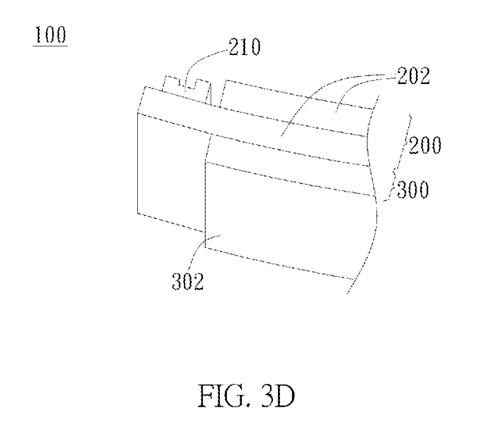

In addition, the support frame may also be designed to be smaller than the display panel such that the support frame is partially or not contacted to the strip region. As shown in FIG. 3D, the support frame 302 is attached to the backside of the display panel 200 and extends to the front edge of the strip region extending along a tangent direction, so that the portion of the substrate where the periphery circuit 210 is disposed thereon is suspended and exposed to the outside of the support frame 302. According to the suspended design, a portion of the substrate can be maintained into the curved shape by using the support frame 302, while the portion of the substrate exposed from the support frame 302, which is not supported by the support frame 302 to maintain the curved shape, can be returned close to the plane through the flexibility of the substrate 202 to achieve the design of different curvatures.

Figure 4A:
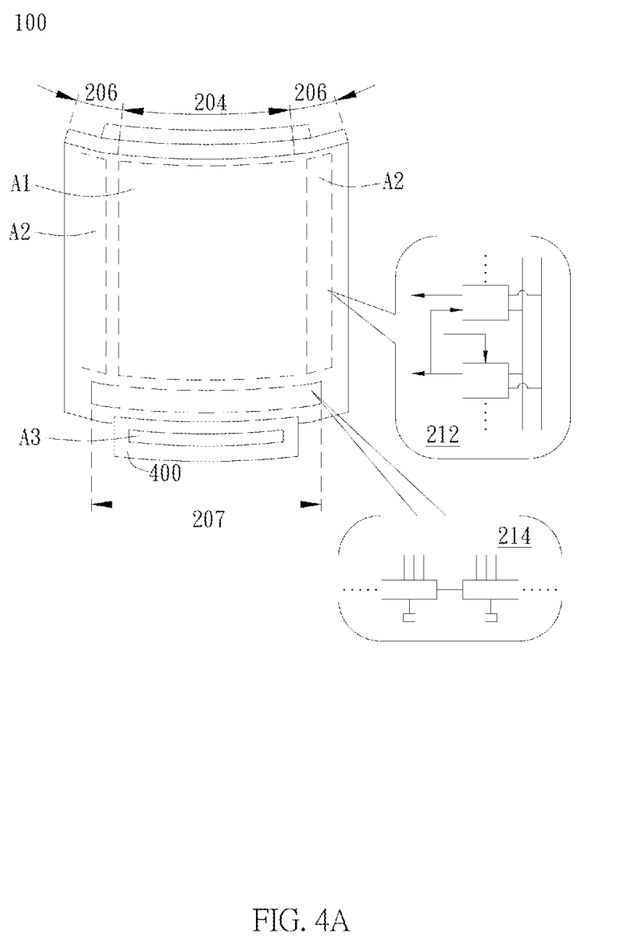
FIGS. 4A through 4C show a display module having different circuit arrangements according to different embodiments of the present invention, respectively.
Figure 4B:
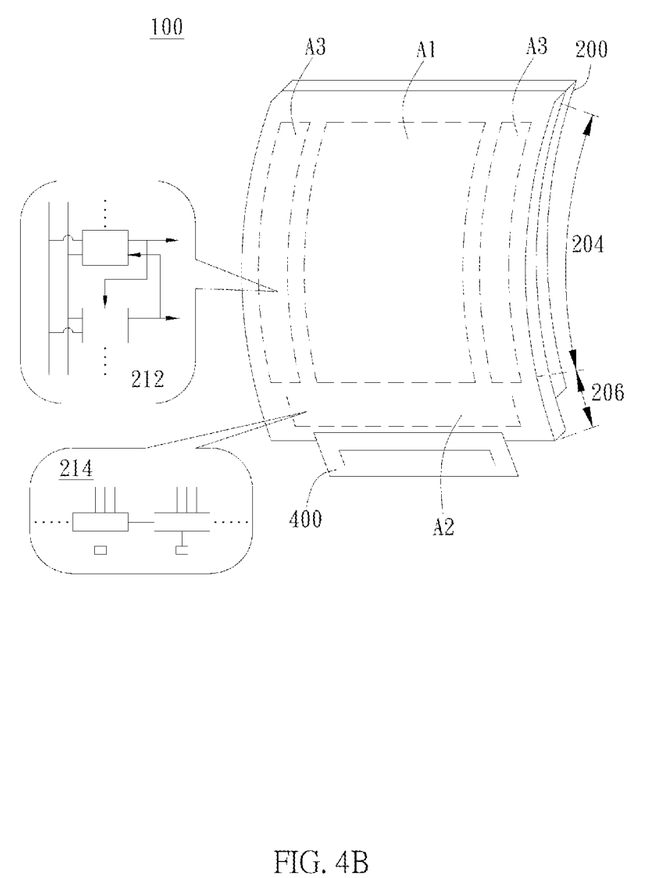
Figure 4C:
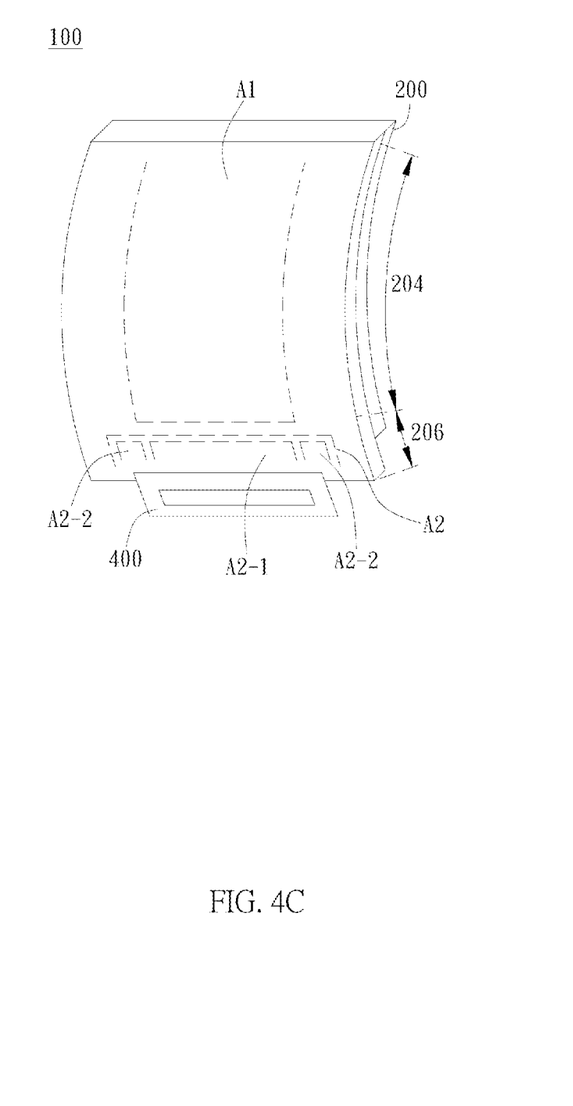

FIGS. 4A through 4C show a display module 100 having different circuit arrangements according to different embodiments of the present invention, respectively. As described above, the periphery circuit is disposed on the strip region having a smaller curvature; however, in the circuit arrangement of the display module, the circuit arrangement can be adjusted according to the principle described above with the actual situation. For example, the periphery circuit disposed on the strip region may be selected from the group consisting of a gate driving circuit, a data driving circuit, a multiplexer circuit, a shift register circuit, and a combination thereof. As shown in FIG. 4A, the display module 100 includes a display panel 200 and a flexible circuit module 400. The substrate 202 of the display panel 200 has a display area 204, a strip region 206, and a circuit layout region 207. The strip region 206 is located outside two sides (left side and right side) of the display area 204 parallel to the axis, and the circuit layout region 207 is located outside one side of the display area 204 perpendicular to the axis. As shown in the dashed box at the backside of the substrate 202, the zone A1 is roughly corresponding to the range of the display area 204 located on the inner side of the substrate 202, the zone A2 is roughly corresponding to the strip region 206, and the zone A3 is roughly corresponding to the circuit layout region 207. The strip region 206 has a smaller curvature than the display area 204. The flexible circuit module 400 is disposed adjacent to the circuit layout region 207 to receive the signals from the strip region 206 and the circuit disposed on the circuit layout region 207. As shown in FIG. 4A, the shift register circuit 212 is preferably disposed corresponding to the strip region 206 (corresponding to the depicted range of zone A2), and the multiplexer circuit 214 is preferably disposed corresponding to the circuit layout region 207 (corresponding to the depicted range of zone A3). Thereby, the shift register circuit 212 disposed on the strip region 206 can use the strip region 206 having a smaller curvature compared to the other portion of the display panel 200 to maintain a better circuit performance.

As shown in FIG. 4B, the display module 100 is designed to have a different curved pattern, wherein the strip region 206 is located on outside one side (lower side) of the display area 204 parallel to the axis, and the circuit layout region 207 is located on both outer sides of the display area 204 perpendicular to the axis. As shown in the dashed box at the backside of the substrate 202, the zone A1 is roughly corresponding to the range of the display area 204 located on the inner side of the substrate 202, the zone A2 is roughly corresponding to the strip region 206, and the zone A3 is roughly corresponding to the circuit layout region 207. Similarly, the strip region 206 located on the lower side of the display area 204 has a smaller curvature than the display area 204. The flexible circuit module 400 is disposed adjacent to the strip region 206. As shown in FIG. 4B, the shift register circuit 212 is disposed corresponding to the strip region 206 located on the lower side of the display area 204 (corresponding to the depicted range of zone A2), and the multiplexer circuit 214 is disposed corresponding to the circuit layout region 207 located on both sides of the display area 204 (corresponding to the depicted range of zone A3). Thereby, the shift register circuit 212 disposed on the strip region 206 can use the strip region 206 having a smaller curvature compared to the other portion of the display panel 200 to maintain a better circuit performance.

In addition, as shown in FIG. 4C, the display module 100 has a curved pattern shown in FIG. 4B. In the embodiment of FIG. 4C, the strip region 206 is located on outside one side (lower side) of the display area 204 parallel to the axis, and the strip region 206 is designed to have an intermediate zone and a side zone to dispose different circuits. As shown in the dashed box at the backside of the substrate 202, the zone A2 of the strip region 206 is divided into a zone A2-1 (corresponding to the intermediate zone) and a zone A2-2 (corresponding to the side zone). The intermediate zone and the side zone have a smaller curvature compared to the display area, respectively. For example, the above multiplexer circuit can be disposed corresponding to the intermediate zone (corresponding to the depicted range of zone A2-1), and the shift register circuit can be disposed corresponding to the side zone (corresponding to the depicted range of zone A2-2). Thereby, the related circuits of the display module 100 can be integrated into the strip region 206 and can use the strip region 206 having a smaller curvature compared to the other portion of the display panel 200 to maintain a better circuit performance.

Figure 5A:
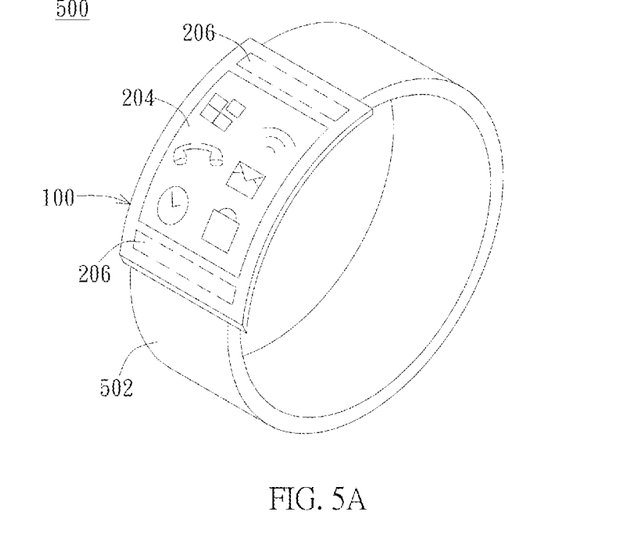
FIGS. 5A through 5B show the display module of the present invention applied to different display devices.

Specifically, the display module of the present invention can be applied to different display devices. As shown in FIG. 5A, the body of the watch 500 uses the aforementioned display module 100 having the design of different curvatures, and a wristband portion 502 is disposed on both sides of the display module 100. The display module 100 has a strip region 206 located on both outer sides of the display area 204 parallel to the axis, that is close to the two ends of the wristband portion 502. The strip region 206 has a smaller curvature compared to the display area 204, whereby the performance of the circuit characteristics of the periphery circuit disposed on the strip region 206 will not be affected with the curved shape of the display panel. It should be noted that the display surface in the foregoing embodiment is formed on the outer convex surface of the display panel, but not limited thereto. The display surface also can be formed on the inner concave surface of the display panel (for example the embodiment in FIG. 5B) depending on the demand.

Figure 5B:
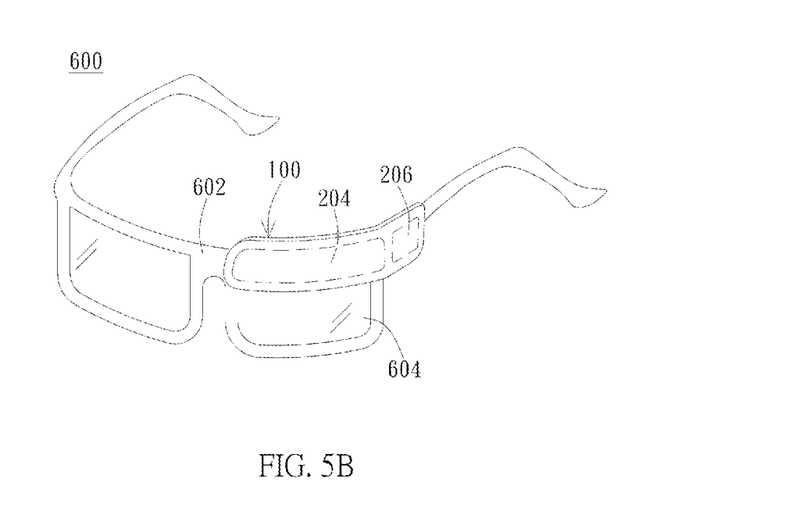

In addition, as shown in FIG. 5B, the glasses 600 includes a frame 602, a paired lenses 604, and a display module 100 attached to one of the paired lenses 604. The display module 100 has a design of curved shape with the appearance of the glasses 600; the portion of the display module 100 extending outwardly from the lens 604 has a strip region 206 and has a smaller curvature. In this way, the performance of the circuit characteristics of the periphery circuit disposed on the strip region 206 will not be affected with the curved shape of the display panel.

Figure 6A:
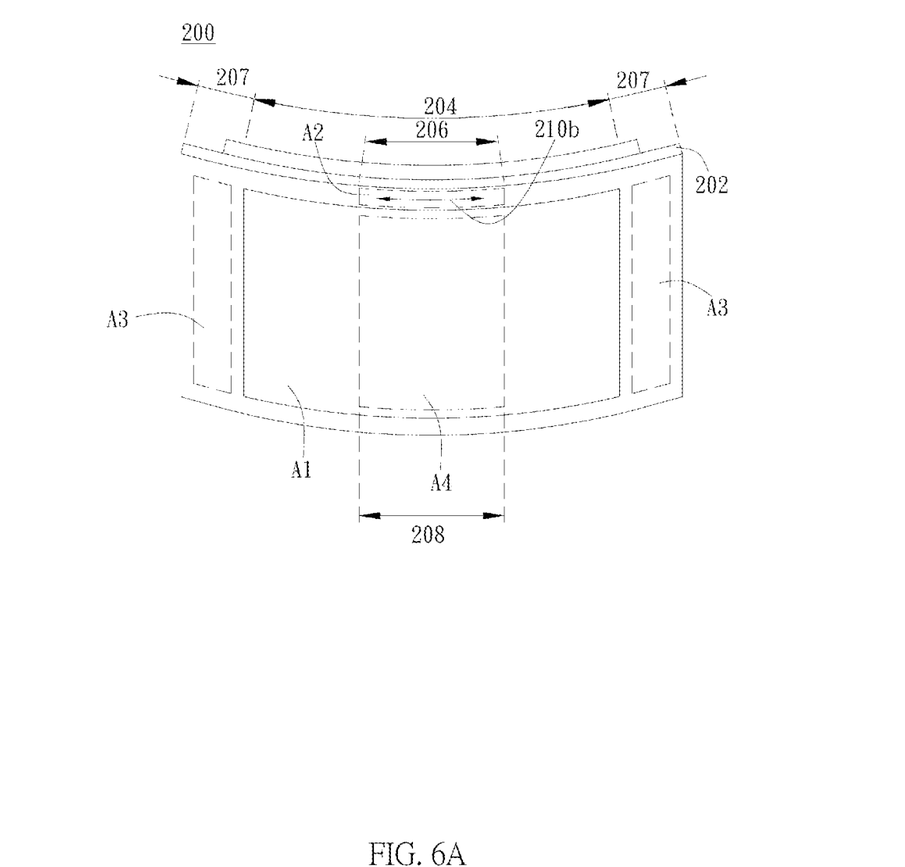
FIGS. 6A through 6C show a front view of a display module according to another embodiment of the present invention.
Figure 6B:
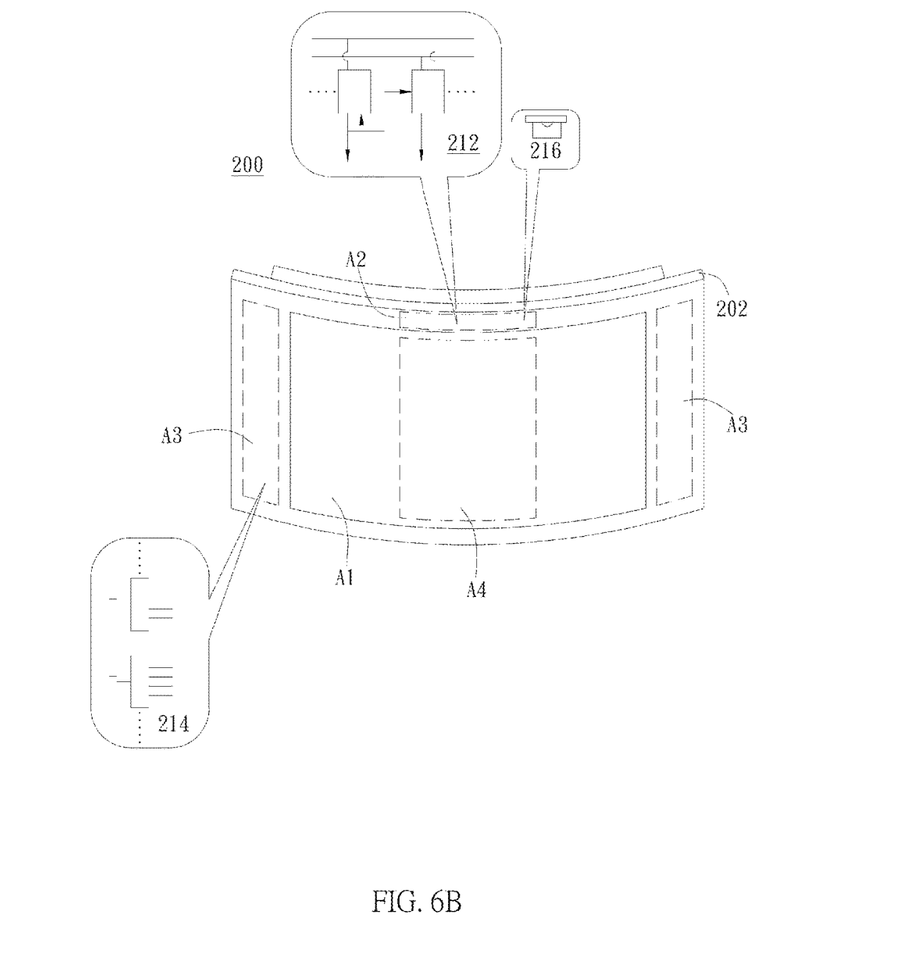

FIGS. 6A and 6B show a front view of a display module according to another embodiment of the present invention. In addition to the foregoing design of the outside of the substrate having a smaller curvature, another design that the substrate 202 at the center with a smaller curvature also can be used. As shown in FIG. 6A, the display area 204 of the substrate 202 is located on the inner side of the substrate 202, and the portion of the substrate 101 corresponding to the center of the display area 204 has a smaller curvature compared to the portion located on both outer sides of the substrate 202 (i.e., the two sides along the transverse curved surface perpendicular to the axis). The both outer sides of the display area 204, i.e. the portion having a larger curvature, have a circuit layout region 207, respectively. The strip region 206 is located outside one side of the display area 204 perpendicular to the axis, i.e., the strip region 206 is located on the outer side (upper side) of the display area 204 along the longitudinal direction of the bending surface. As shown in the dashed box at the backside of the substrate 202, the zone A1 is roughly corresponding to the range of the display area 204 located on the inner side of the substrate 202, the zone A2 is roughly corresponding to the strip region 206, and the zone A3 is roughly corresponding to the circuit layout region 207.

On the other hand, the periphery circuit (as shown in FIG. 6B which includes the light detection circuit 216 and the shift register circuit 212) is disposed on the strip region (corresponding to the depicted range of zone A2). The periphery circuit is distributed in an elongated strip and has an extension direction 210b perpendicular to the axis. As shown in FIG. 6A, the display area 204 has a flat region 208 parallel to the axis across the display area 204 (the longitudinal direction of the bending surface) and projectively corresponding to the periphery circuit 210 in a direction parallel to the axis. As shown in the dashed box at the backside of the substrate 202, the zone A4 is roughly corresponding to the range of the flat region 208. In other words, the flat region 208 (the center of the substrate) has a curvature smaller than the portion of the display area 204 on both sides of the flat region 208 (the portion on both outer sides of the substrate). In the circuit arrangement of the display panel 200, the periphery circuit can be disposed on the strip region 206 having a smaller curvature. For example, the periphery circuit disposed on the strip region 206 can be selected from a light detection circuit, a multiplexer circuit, a shift register circuit, or a combination thereof. As shown in FIG. 6B, the shift register circuit 212 and the light detection circuit 216 are disposed corresponding to the strip region 206 (corresponding to the depicted range of zone A2), and the multiplexer circuit 214 is disposed corresponding to the circuit layout region 207 (corresponding to the depicted range of zone A3). In this way, the shift register circuit 212 and the light detection circuit 216 disposed on the strip region 206 can use the strip region 206 having a smaller curvature compared to the other portion of the display panel to maintain a better circuit performance. In other embodiments, depending on the demand, the multiplexer circuit 214 and the light detection circuit 216 can be disposed corresponding to the strip region 206 while the shift register circuit 212 can be disposed corresponding to the circuit layout region 207, so that the periphery circuit disposed on the strip region 206 can maintain a better circuit performance.

Figure 6C:
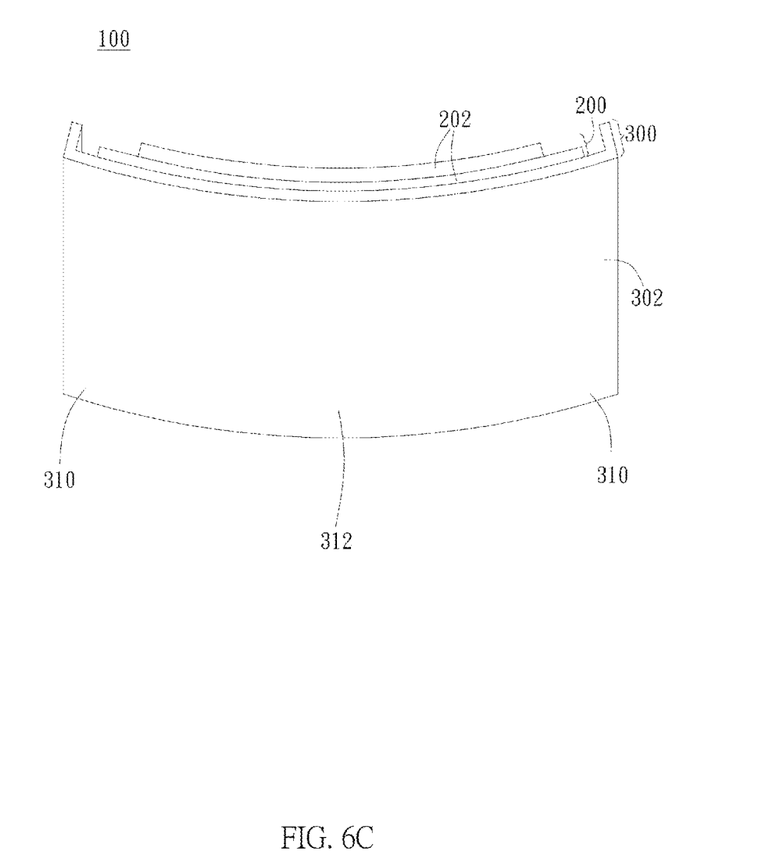

Refer to FIG. 6C, which shows the approach of forming different curvatures on the substrate shown in FIG. 6A and FIG. 6B. As shown in FIG. 6C, the backlight module 300 is disposed on the backside of the display panel 200, and the backlight module 300 includes a support frame 302 supporting the substrate 202 on a side opposite to the periphery circuit and maintaining the substrate 202 into the curved shape. The portion of the support frame 302 corresponding to the strip region and the flat region has a curvature smaller than another portion of the support frame 302. As shown in FIG. 6A and FIG. 6C, the support frame 302 has a bending portion 310 corresponding to the portion of the display area 204 on both sides of the flat region 208 (i.e., two outer sides of the flat region 208 parallel to the axis), and the bending portion 310 is attached to the substrate 202 to maintain the substrate 202 into the curved shape; on the other hand, the support frame 302 further has a flat portion 312 corresponding to the portions of the strip region 206 and the flat region 208. The flat portion 312 is attached to the center of the substrate 202 so as to maintain the center of the substrate be flatter than both sides of the substrate 202. In other words, the flat portion 312 is designed into a flat shape with a smaller curvature corresponding to the flat region. Thereby, because the portion of the substrate 202 attached to the flat portion 312 of the support frame 302 can maintain the flat shape by the flat portion 312, a smaller curvature can be formed along the bending direction (i.e., in a direction perpendicular to the axis) compared to both sides of the display area, so that the foregoing flat region 208 can be formed at the center of the substrate 202 to achieve the design of different curvatures.

As described in above, the display module of the present invention can utilize the substrate having the design of different curvatures to dispose the periphery circuit on the outer sides of the substrate having a curvature smaller than the display area, so that the circuit performance can be enhanced and the circuit reliability of the circuits in the display module can be improved accordingly.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A display module, comprising:
 a display panel, comprising:
  a substrate having a display area and a strip region beside the display area, wherein the substrate is bent with respect to an axis to form a curved shape, the strip region is located outside a side of the display area parallel to the axis, the maximum value of the curvature of the display area in a direction perpendicular to the axis is a first curvature;
  a periphery circuit disposed on the strip region; and
 a backlight module disposed on the backside of the display panel, the backlight module including:
  a support frame for supporting the substrate on a side opposite to the periphery circuit and maintaining the substrate into the curved shape, the support frame having a display-facing surface with a peripheral edge positioned beyond an outermost edge of the strip region, the display-facing surface having a first region and a depression region, the first region contacting the substrate, the depression region being located between the first region and the peripheral edge, and defining a region of non-contact between the display-facing surface and the substrate;
  wherein the strip region in a direction perpendicular to the axis has a second curvature smaller than the first curvature.

2. The display module of claim 1, wherein the periphery circuit is selected from the group consisting of a gate driving circuit, a data driving circuit, a multiplexer circuit, a shift register circuit, and a combination thereof.

3. The display module of claim 1, wherein the periphery circuit is distributed in an elongated strip and has an extension direction parallel to the axis.

4. The display module of claim 1, wherein the depression region extends through the portion of the support frame to form a hollowed portion.

5. The display module of claim 1, wherein the strip region is located outside a side of the display area perpendicular to the axis.

6. The display module of claim 5, wherein the periphery circuit includes a light detection circuit.

7. The display module of claim 5, wherein the periphery circuit is distributed in an elongated strip, and the periphery circuit has an extension direction perpendicular to the axis.

8. The display module of claim 5, wherein the display area has a flat region parallel to the axis across the display area and projectively corresponding to the periphery circuit in a direction parallel to the axis, the flat region has a curvature smaller than the portion of the display area on both sides of the flat region.

9. The display module of claim 8,
 wherein the support frame has a flat part and a curved part, the flat part is disposed corresponding to the strip region and the flat region, and the curved part is disposed corresponding to both outer sides of the flat region parallel to the axis.

* * * * *